(12) United States Patent
Co

(10) Patent No.: US 7,221,727 B2
(45) Date of Patent: May 22, 2007

(54) ALL-DIGITAL PHASE MODULATOR/DEMODULATOR USING MULTI-PHASE CLOCKS AND DIGITAL PLL

(75) Inventor: Ramon S. Co, Trabuco Canyon, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 797 days.

(21) Appl. No.: 10/249,335

(22) Filed: Apr. 1, 2003

(65) Prior Publication Data

US 2004/0196939 A1 Oct. 7, 2004

(51) Int. Cl.
*H03D 3/24* (2006.01)
(52) U.S. Cl. ........................... 375/376; 327/147
(58) Field of Classification Search ............... 375/371, 375/373, 375, 376, 316, 324, 327, 354, 374; 327/141, 144, 147, 155, 156
See application file for complete search history.

(56) References Cited

U.S. PATENT DOCUMENTS

| | | | | |
|---|---|---|---|---|
| 3,916,340 | A * | 10/1975 | Shuda | 327/165 |
| 4,513,427 | A | 4/1985 | Borriello et al. | 375/360 |
| 4,584,695 | A | 4/1986 | Wong et al. | 375/327 |
| 4,821,297 | A | 4/1989 | Bergmann et al. | 375/376 |
| 5,491,729 | A | 2/1996 | Co et al. | 375/376 |
| 5,502,750 | A | 3/1996 | Co et al. | 375/372 |
| 5,602,882 | A | 2/1997 | Co et al. | 375/372 |
| 6,028,727 | A | 2/2000 | Vishakhadatta et al. | 360/51 |
| 6,087,968 | A | 7/2000 | Roza | 341/143 |
| 6,175,385 | B1 | 1/2001 | Kohiyama et al. | 348/537 |
| 6,219,397 | B1 | 4/2001 | Park | 375/376 |
| 6,259,482 | B1 | 7/2001 | Easley et al. | 348/485 |
| 6,359,949 | B1 | 3/2002 | Okada et al. | 375/376 |
| 6,392,496 | B1 | 5/2002 | Lee et al. | 331/17 |
| 6,449,017 | B1 | 9/2002 | Chen | 348/539 |
| 6,493,408 | B1 | 12/2002 | Kobayashi | 375/357 |
| 6,693,987 | B1 * | 2/2004 | Hattori | 375/376 |
| 2002/0033737 | A1 | 3/2002 | Staszewski et al. | 331/17 |
| 2002/0163325 | A1 | 11/2002 | Nilsson | 324/76.53 |
| 2002/0191727 | A1 | 12/2002 | Staszewski et al. | 375/376 |
| 2003/0039330 | A1 * | 2/2003 | Castiglione et al. | 375/376 |
| 2003/0040276 | A1 | 2/2003 | Corn | 455/42 |

OTHER PUBLICATIONS

M. Schwartz, "Information Transmission, Modulation, and Noise", 3rd edition, McGraw-Hill, 1980, pp. 224-233.

* cited by examiner

*Primary Examiner*—Kevin Burd
(74) *Attorney, Agent, or Firm*—g Patent LLC; Stuart T. Auvinen

(57) ABSTRACT

Multi-phase clocks are used to encode and decode signals that are phase-modulated. The input signal is phase-compared with a feedback clock. Phase differences increment or decrement an up/down counter. The count value from the up/down counter is applied to a phase rotator, which selects one clock phase from a bank of multi-phase clocks. The multi-phase clocks have the same frequency, but are offset in phase from each other. An output divider divides the selected multi-phase clock to generate a phase-modulated output. A feedback divider divides a fixed-phase clock from the multi-phase clocks to generate the feedback clock. An analog or a digital front-end may be used to convert analog inputs to digital signals to increment or decrement the counter, or to encode multiple digital bits as phase assignments. For a de-modulator, a digital-to-analog converter (DAC) or a digital decoder produces the final output from the count of the up/down counter.

9 Claims, 8 Drawing Sheets

ALL-DIGITAL PHASE MODULATOR/DEMODULATOR USING MULTI-PHASE CLOCKS AND DIGITAL PLL

BACKGROUND OF INVENTION

This invention relates to electronic signal transmission, and more particularly to using all-digital Phase-locked loops (PLL's) in modulators and demodulators.

Digital implementations of phase-locked loops (PLL's) are widely used in various applications, such as digital communications and clock/data recovery. Conventional implementations of digital phase-locked loops normally use a numerically controlled oscillator (NCO) as the frequency source. An NCO (also known as a digitally controlled oscillator or DCO), particularly one implemented as counter, suffers from phase resolution or frequency granularity at high frequency.

Another type of digital PLL uses a set of multi-phase clocks rather than a variable-frequency oscillator. Using Multi-phase clocks can improve the phase resolution of digitally implemented oscillators. Phase resolution is improved by sequentially selecting a phase (in ascending and descending order) from the multiphase clocks and then feeding the selected phase to a clock divider. Thus, a variable digital oscillator is constructed whose phase can be finely adjusted without altering the nominal oscillation frequency.

Analog components, such as a tapped delay line or a voltage-controlled oscillator (VCO), have been used for some oscillator applications, such as modulating or de-modulating signals in communications systems. However, these analog components are difficult to integrate with large digital system chips. Thus all-digital oscillators are preferable.

FIG. 1 shows a prior-art digital PLL using multi-phase clocks instead of a variable-frequency oscillator. The loop includes phase detector 10, up/down counter 12, phase rotator 14, and divider 18. Multi-phase clocks 20 have different phase offsets that are spaced equally and in a sequence. Multi-phase clocks 20 are applied to phase rotator 14, which selects one of the multi-phase clocks 20 as the output clock OUT_CLK.

Phase detector 10 compares the phase of input clock IN_CLK to the phase of feedback clock FB_CLK from divider 18. When the phase of the feedback clock lags the phase of the input clock, phase detector 10 generates a signal to decrement up/down counter 12. Decrementing up/down counter 12 causes phase rotator 14 to select a multiphase clock from multi-phase clocks 20 with a leading phase. Conversely, when the phase of the feedback clock leads the phase of the input clock, phase detector 10 generates a signal to increment up/down counter 12. Incrementing up/down counter 12 causes phase rotator 14 to select from multi-phase clocks 20 a multiphase clock with a lagging phase. Thus, a digital feedback loop is created that allows the phase of the feedback clock (and output clock) to track the phase of the input clock.

Up/down counter 12 can be a modulo-M counter that is updated every cycle of the feedback clock. Hence, the phase of the feedback clock in each clock cycle can only change by one phase increment of the multiphase clocks. The selected phase $\phi R$ from multiphase clocks $\phi [0:M-1]$ is selected by phase rotator 14 and applied to divider 18.

Multi-phase clock generator 16 generates multi-phase clocks 20 from a reference clock REF_CLK. A ring oscillator or a delay-locked loop (DLL) can be used for multi-phase clock generator 16. Differential buffers or standard inverters can be used in a ring or delay line, and the oscillation frequency can be changed by adjusting a bias to the buffers or inverters, such as a bias for a current source or sink.

The frequency of multi-phase clocks 20 can be an Nth multiple of the input signal frequency of IN_CLK. This permits phase selection by phase rotator 14, and the phase adjustment on the output clock, to have M×N resolutions.

However, IN_CLK and REF_CLK may be asynchronous. When the frequency of multi-phase clocks 20 is not an Nth multiple of the input clock IN_CLK, a frequency offset exists. Phase rotator 14 will constantly rotate forward or backward in phase in order to accommodate the frequency difference between the input clock and multi-phase clocks 20.

FIG. 2 is a waveform diagram showing multi-phase clocks. In this example M is 8, so that 8 multi-phase clocks $\phi 0$-$\phi 7$ are generated by the multi-phase clock generator. Each pair of adjacent multi-phase clocks are offset from each other in phase by one-eighth of the clock period of the multi-phase clocks. The phase rotator selects one of these multi-phase clocks as the output clock in response to the current count of the up/down counter.

While such digital PLL's that employ multi-phase clocks are useful as basic oscillators for generating clocks, the use of these digital PLL's in other applications is desirable. In particular, the use of multi-phase clocks for signaling and communication systems is desirable. Rather than simply use a digital PLL to generate fixed-frequency clocks, it is desired to modulate the frequency to encode signals, such as with phase modulation and frequency modulation (FM). It is desired to encode and decode signals for transmission using multi-phase clocks and a structure similar to a digital PLL. An all-digital phase modulator and demodulator using multi-phase clock rotation is desirable.

DETAILED DESCRIPTION

The present invention relates to an improvement in signal modulators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
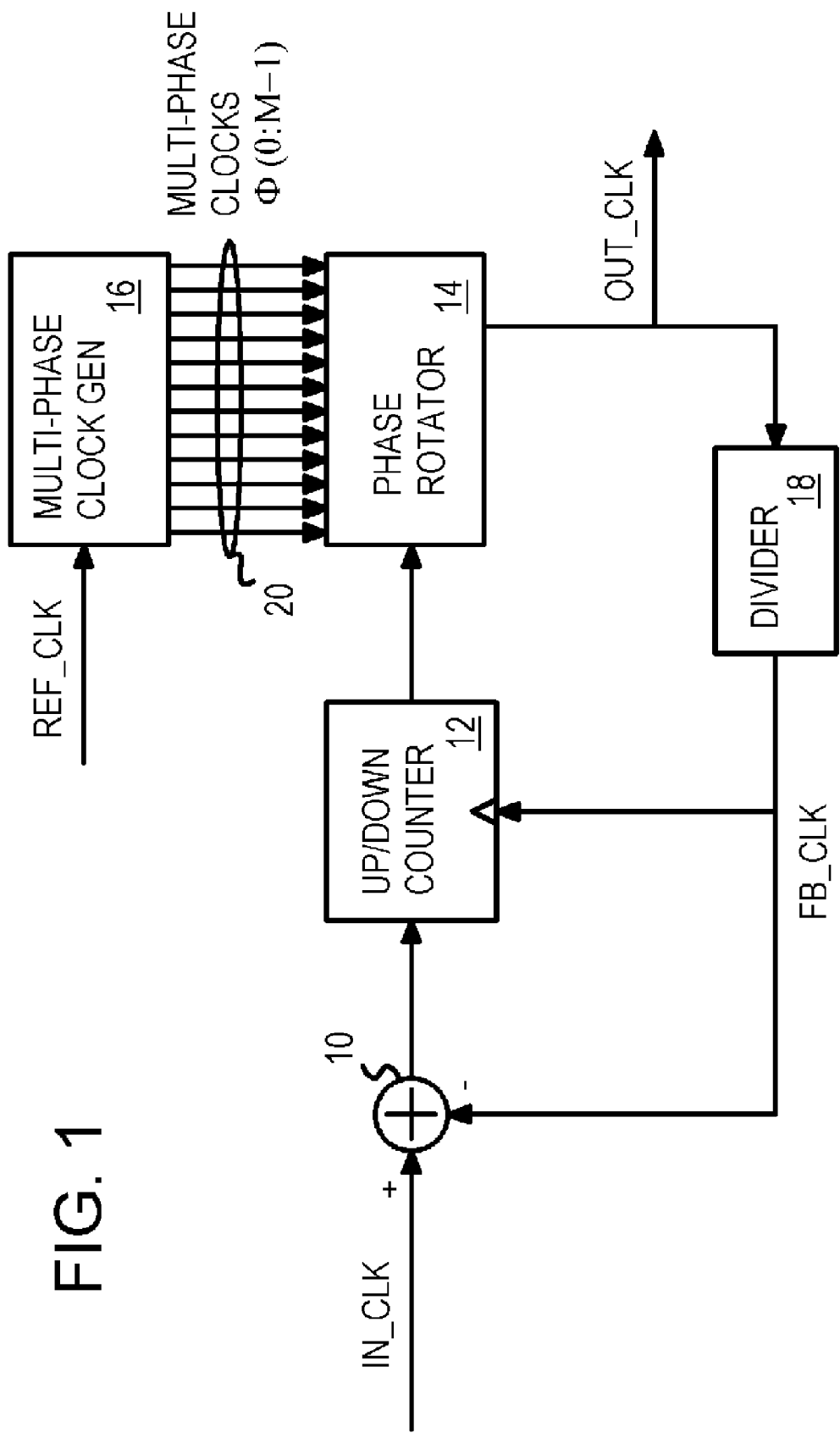
FIG. 1 shows a prior-art digital PLL using multi-phase clocks instead of a variable-frequency oscillator.
Figure 2:
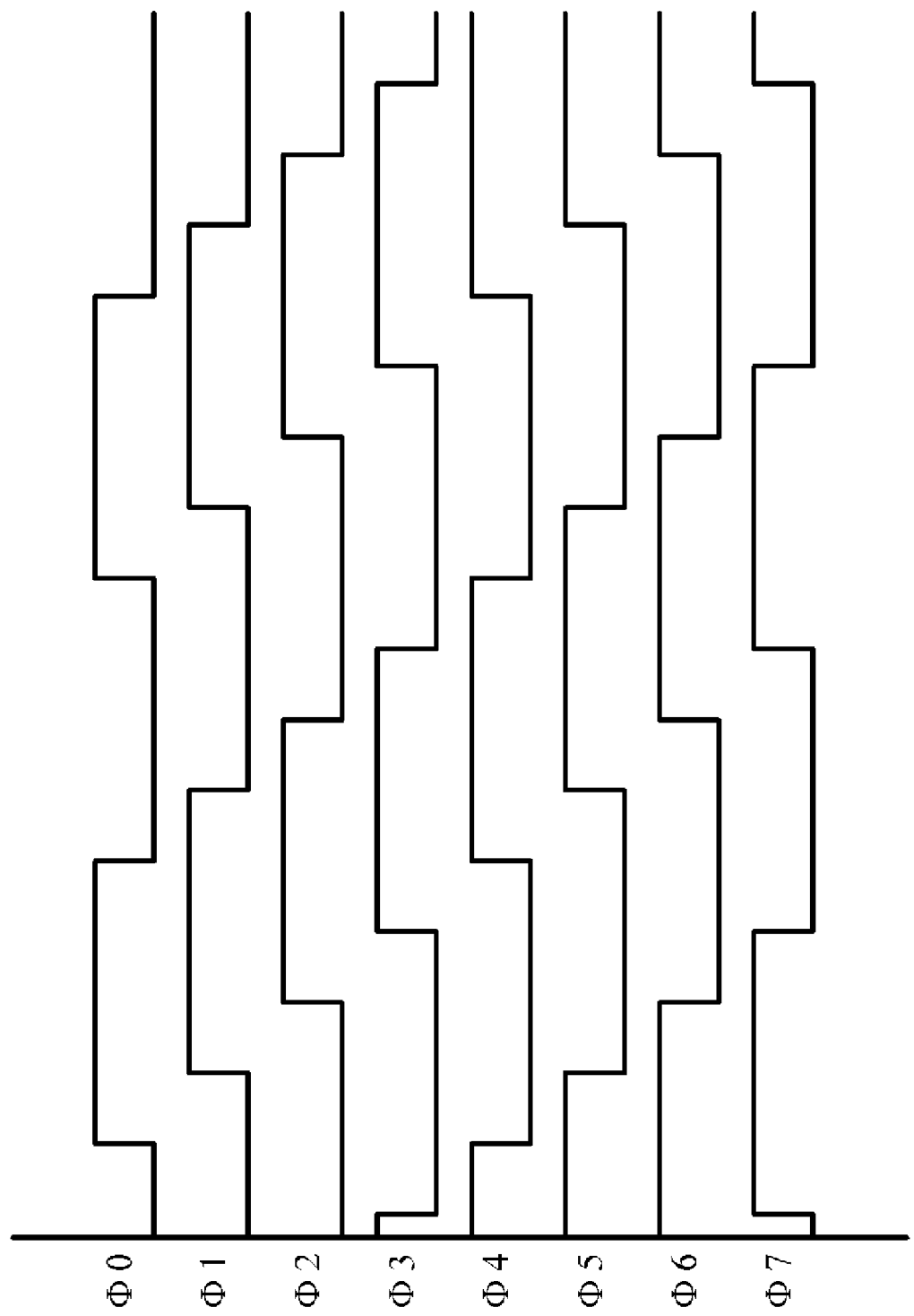
FIG. 2 is a waveform diagram showing multi-phase clocks.
Figure 3:
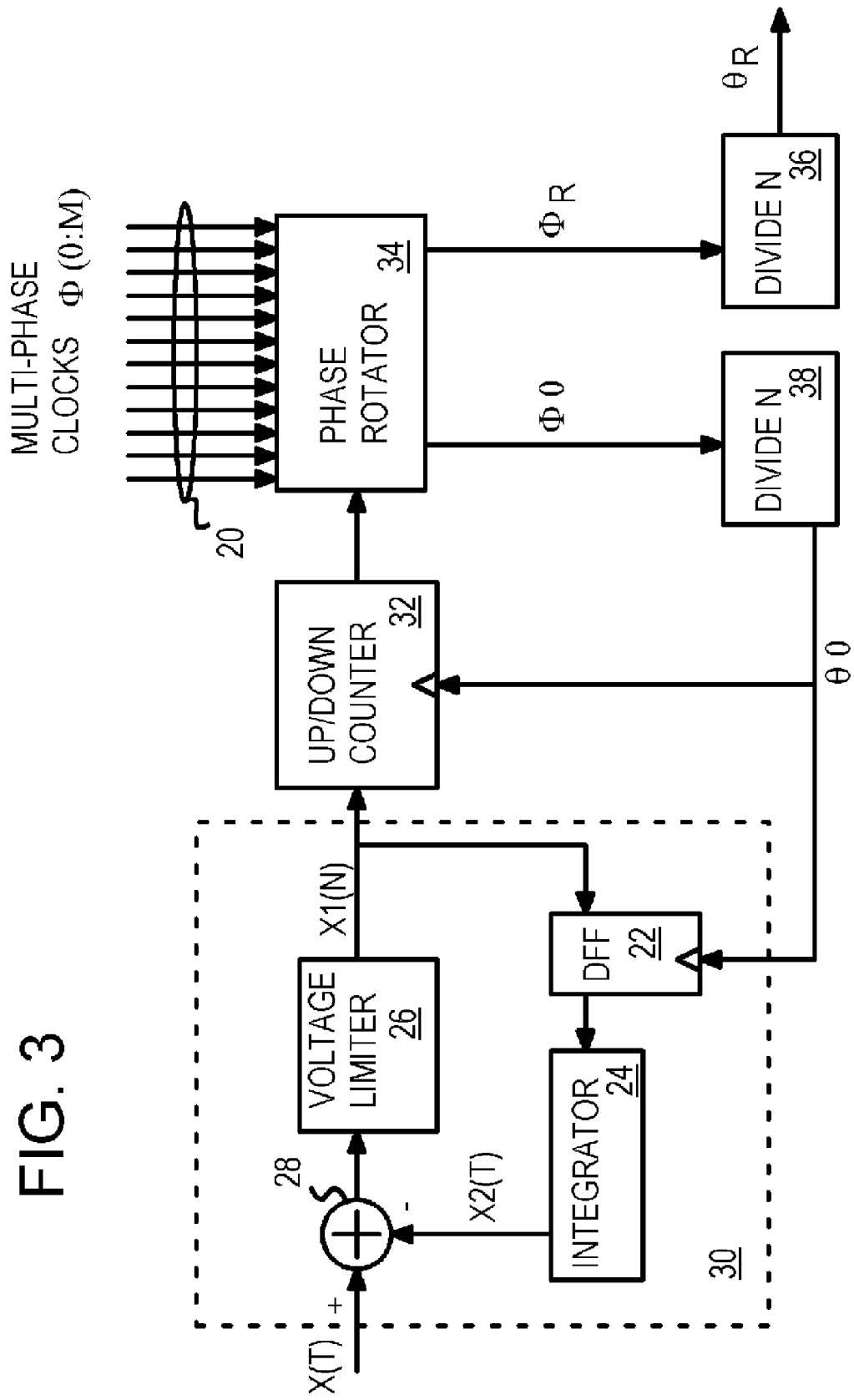
FIG. 3 is a block diagram of a modulator using multi-phase clocks with an analog-front end.

FIG. 3 is a block diagram of a modulator using multi-phase clocks with an analog-front end. Analog front end 30 receives analog input x(t) that is an input signal to be modulated. The modulated output is modulated carrier θ R generated from rotated clock φ R from phase rotator 34.

Analog front end 30 outputs digital signal x1(n) to up/down counter 32, which increments or decrements the count and the phase selected by phase rotator 34 from multi-phase clocks 20. The selected phase clock is output as rotated clock φ R, which is divided by output divider 36 to generate modulated carrier θ R. Modulated carrier θ R can be transmitted over a communications medium.

Phase rotator 34 has two outputs. One output has a fixed phase, while the other output varies in phase in response to the input from up/down counter 32. Phase rotator 34 has a fixed-phase output that always outputs the first clock φ 0 of multi-phase clocks 20, regardless of the input from up/down counter 32.

The other output of phase rotator 34 varies in phase. Up/down counter 32 controls phase rotator 34's selection of multi-phase clocks 20 for rotated output φ R. Output φ R is input to output divider 36, which generates θ R. Thus a fixed clock φ 0 is output to feedback divider 38, but a phase-varying clock φ R is output to output divider 36. The modulated carrier θ R is generated by output divider 36 by dividing the rotated phase φ R by N.

Feedback divider 38 generates un-modulated carrier θ 0 by dividing the first clock φ 0 of multiphase clocks 20 by N. Un-modulated carrier θ 0 is used as a clock to update up/down counter 32 and to clock analog front end 30.

Analog front end 30 acts as a delta modulator and performs an analog-to-digital conversion. Analog input x(t) is converted to digital signal x1(n) that controls incrementing and decrementing of up/down counter 32. Voltage comparator 28 compares the voltage of input x(t) to that of analog-estimate signal x2(t). Voltage comparator 28 can be a voltage summing or difference circuit.

Limiter 26 limits the voltage difference from comparator 28, which is a voltage representing the voltage difference between analog input x(t) and analog-estimate signal x2(t). Positive differences produce a 1 output from limiter 26, while negative differences produce a 0 output on x1(N). The resulting binary sequence x1(n) from limiter 26 is the delta-modulated sequence.

The digital sequence x1(n) is applied to up/down counter 32, which counts up or counts down in response to x1(n). Binary sequence x1(n) is also clocked by θ 0 in D-flip-flop 22 and input to integrator 24. Integrator 24 converts the small digital changes in x1(n) into small analog signals, and then accumulates the converted small analog signals to produce analog-estimate x2(t). Integrator 24 can be an op amp with a feedback capacitor from its output to its negative input and an input resistor to its negative input. The positive input of the op amp can be tied to signal-ground. Filtering can be provided to integrator 24 by adding a feedback resistor from the output to the negative input of the op amp. Whereas up/down counter 32 holds the digital value estimate of analog input x(t), integrator 24 holds the analog value estimate of x(t).

Figure 4:
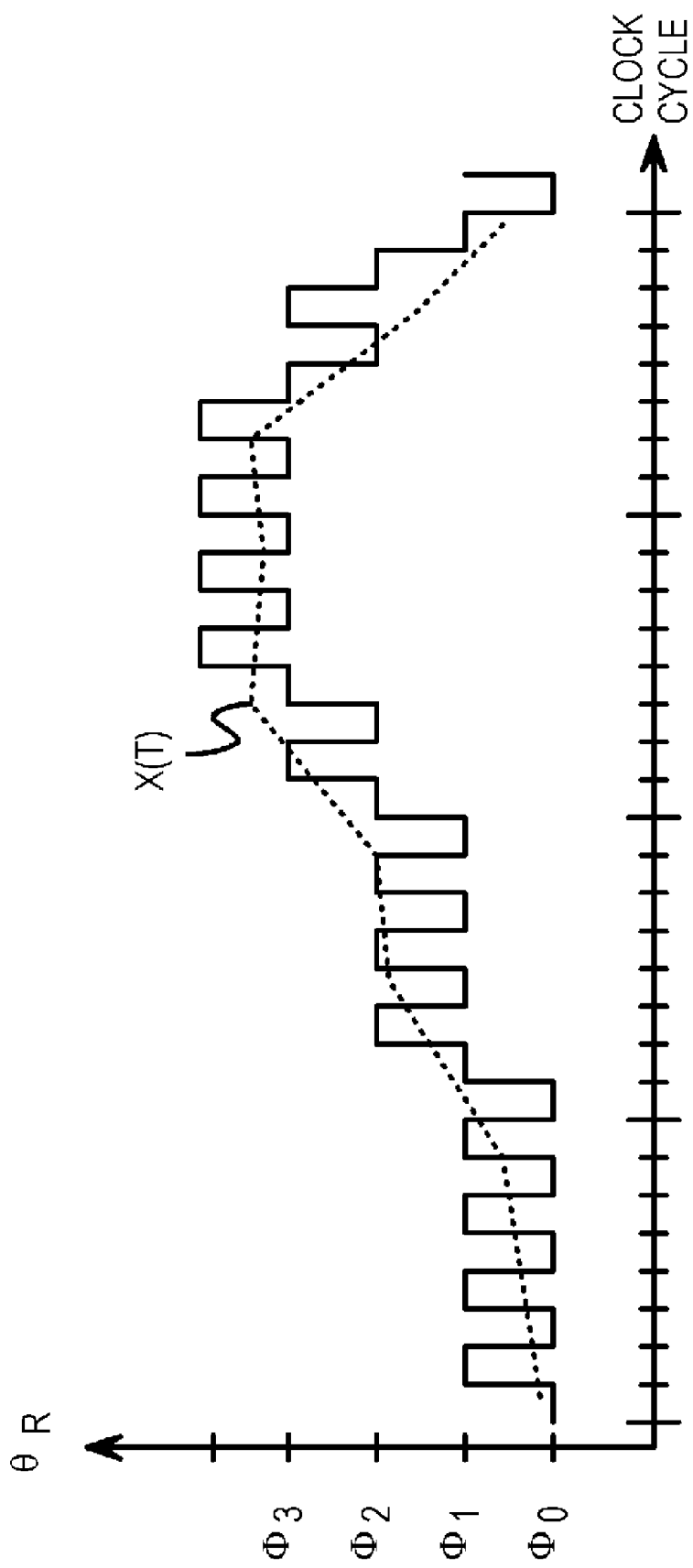
FIG. 4 is a waveform showing modulation phase changes in response to the analog input.

FIG. 4 is a waveform showing modulation phase changes in response to the analog input. In this simple example, several multi-phase clocks (φ 0:5) encode the input signal. The analog input x(t) is converted to digital signal x1(n), which increments and decrements up/down counter 32 (FIG. 3). The output of up/down is determined by this output of up/down counter 32.

The discrete phase changes on modulated carrier θ R contain the digitized information for the analog input x(t). The discrete phase changes on θ R follow analog input x(t). Modulated carrier θ R can be transmitted over a communications medium and received by a receiver that contains a demodulator.

Figure 5:
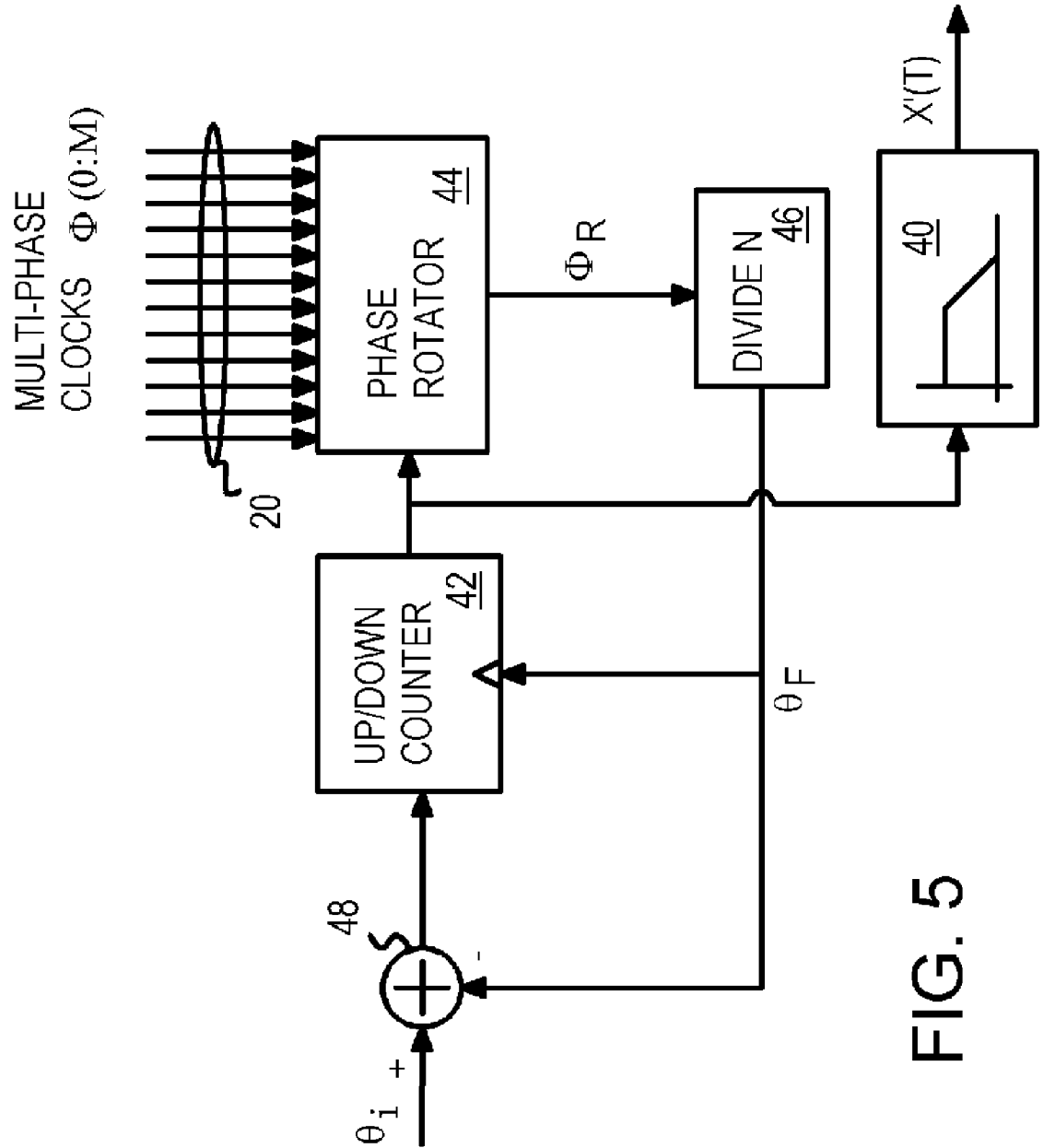
FIG. 5 shows a de-modulator using multi-phase clocks and conversion to an analog output.

FIG. 5 shows a de-modulator using multi-phase clocks and conversion to an analog output. A phase-modulated signal θ i is received from a communications medium and input to phase comparator 48. Phase comparator 48 compares the phase of the received signal θ i to the phase of the feedback signal θ F. Phase differences increment or decrement up/down counter 42.

The count value from up/down counter 42 is sent to phase rotator 44, causing one of multi-phase clocks 20 to be selected as the rotated clock φ R. The phase selected varies with changes in the count value from up/down counter 42, which changes as a result of phase differences detected by phase comparator 48.

The selected clock φ R is divided by divider 46 to generate the feedback signal θ F to phase comparator 48. Up/down counter 42 is clocked by feedback signal θ F.

The count value from up/down counter 42 changes in response to phase changes on the phase-modulated input θ i. Thus the count value in up/down counter 42 represents the phase encodings of the input signal θ i. The count value from up/down counter 42 is applied to converter 40, which converts the digital count values to analog voltages of analog signal x'(t). Analog signal x'(t) is a reconstruction of analog signal x(t) of FIG. 3, which was the analog input that was transmitted as phase-modulated signal θ R and θ i. Phase-modulated carrier θ R (FIG. 3) is the transmitted signal while input signal θ i (FIG. 5) is the received signal. Both contain the same phase-encoded information.

Converter 40 can be a D/A converter followed by a low-pass filter. Low pass filtering after the D/A smoothes out a stair-step waveform from the D/A.

Figure 6:
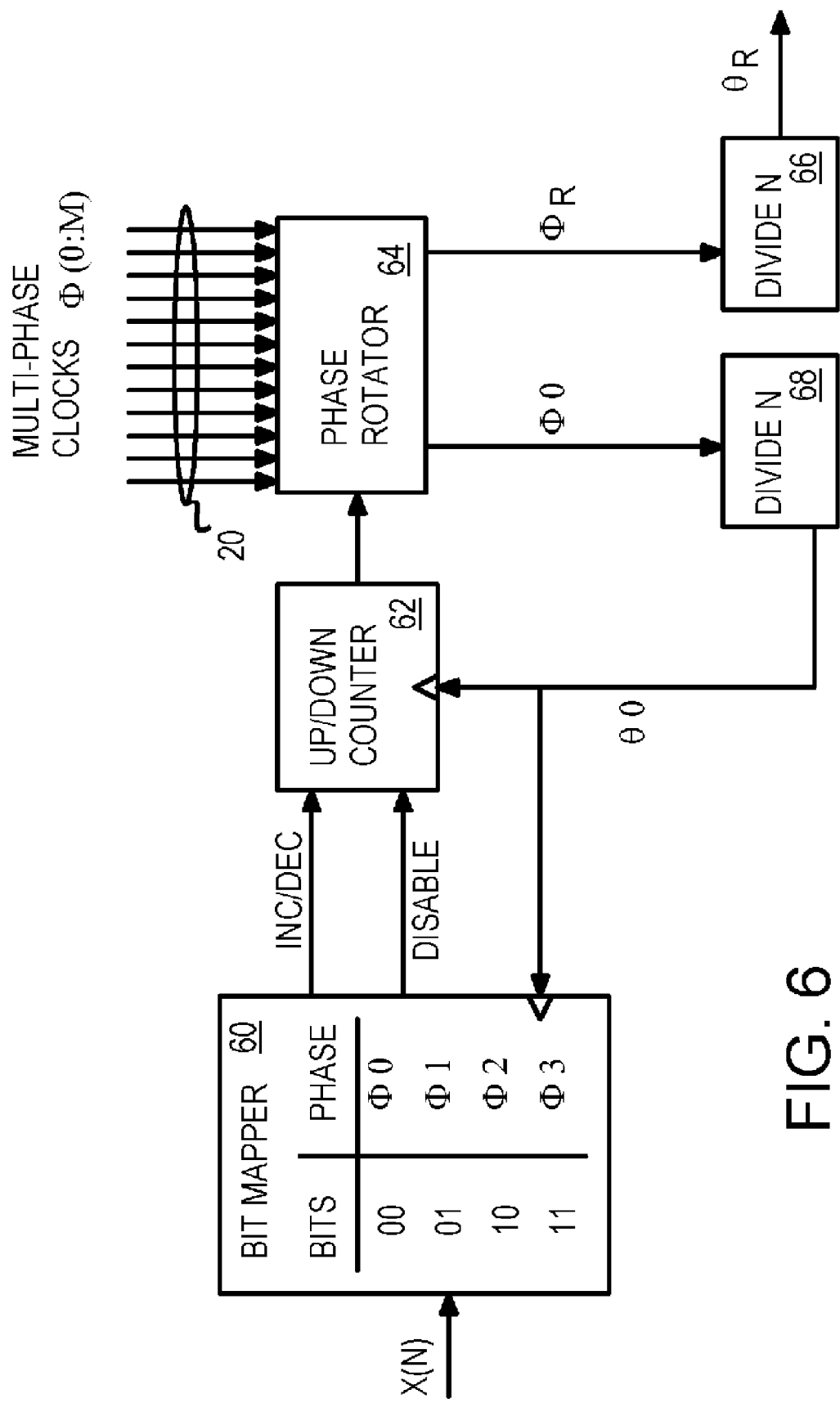
FIG. 6 shows a phase modulator using multi-phase clocks that receives a digital signal for phase encoding.

FIG. 6 shows a phase modulator using multi-phase clocks that receives a digital signal for phase encoding. Up/down counter 62 is incremented or decremented to encode values of digital input x(n). The count value from up/down counter 62 is applied to phase rotator 64, which selects one of multi-phase clocks 20 as the rotated clock φ R. The phase of rotated clock φ R varies with the count value from up/down counter 62. The modulated output θ R is generated by output divider 66 by dividing rotated clock φ R by divisor N.

A constant-phase feedback clock φ 0 is also output by phase rotator 64. Feedback clock φ 0 can be the first phase clock of multi-phase clocks 20, or can be another phase clock of multi-phase clocks 20. However, the phase of feedback clock φ 0 remains constant and does not vary with the count value from up/down counter 62. Feedback divider 68 divides feedback clock φ 0 by a divisor N to generate feedback signal θ 0, which clocks up/down counter 62 and bit mapper 60.

Digital input signal x(n) is encoded by bit mapper 60. Bit mapper 60 assigns a group of bits (a symbol) from digital input x(n) to a specific phase of the multiphase clocks. For example, the following mapping can be used for a group of 3 binary bits:

Phase Assignment Table

| Bits | Phase Assignment |
|---|---|
| 000 | φ 0 |
| 001 | φ 1 |
| 010 | φ 2 |
| 011 | φ 3 |
| 100 | φ 4 |
| 101 | φ 5 |
| 110 | φ 6 |
| 111 | φ 7 |

Bit mapper 60 also ensures that a smooth phase transition occurs from one phase assignment to the next phase assignment. For example, if the current phase assignment is φ 3 and the next phase assignment is φ 6, bit mapper 60 first transitions from φ 3 to intermediate phase assignments φ 4 and φ 5, before finally transitioning to φ 6. Similarly, if the current phase assignment is φ 3 and the next phase assignment is φ 1, bit mapper 60 first transitions from φ 1 to φ 2 before finally transitioning to φ 1. The smooth phase transition is accomplished by simply incrementing or decrementing the up/down counter by one rather than larger values. A current phase assignment can be maintained by disabling the up/down counter or using a multi-bit increment-decrement signal.

Figure 7:
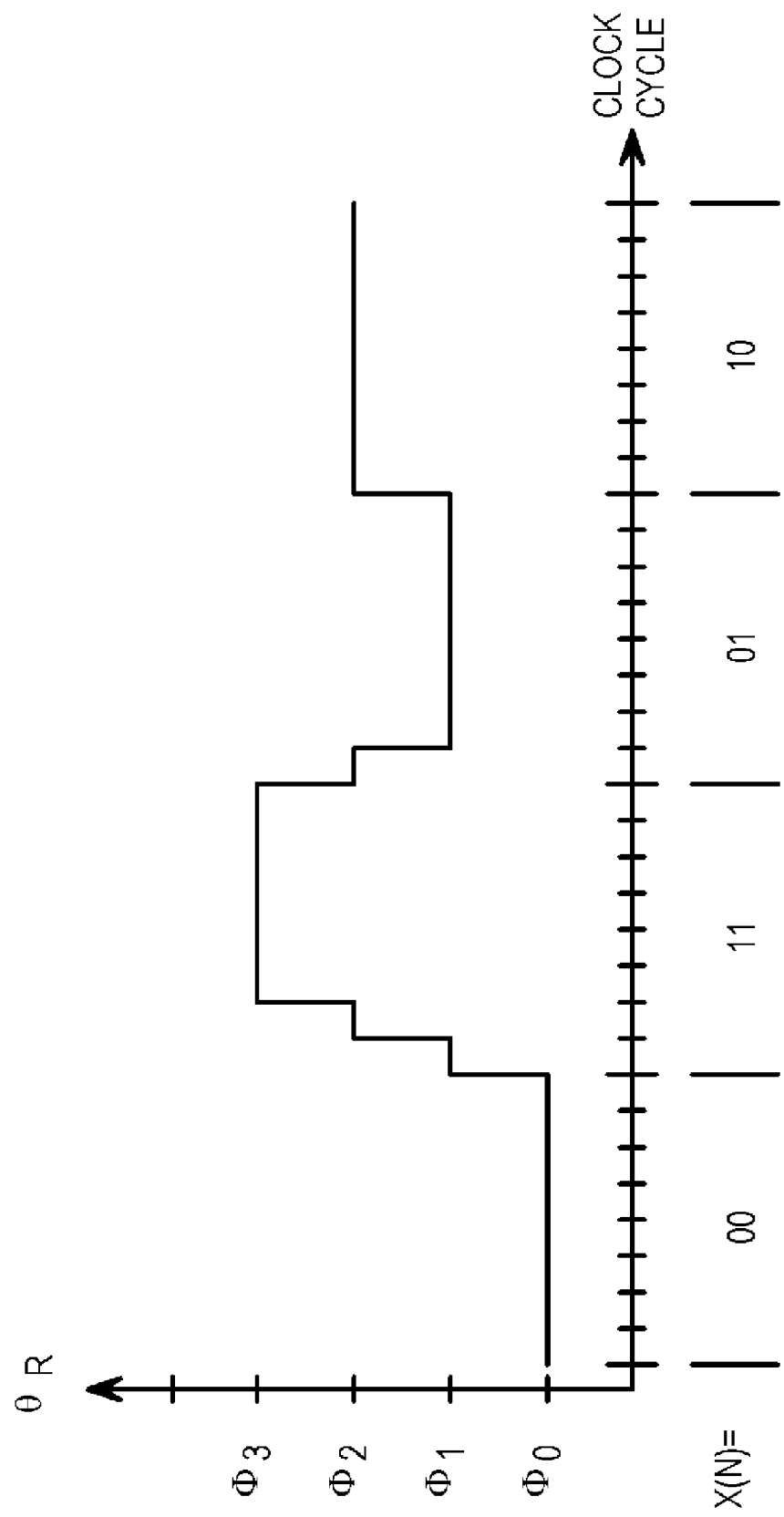
FIG. 7 is a waveform showing phase-encoding of a digital input using multi-phase clocks.

FIG. 7 is a waveform showing phase-encoding of a digital input using multi-phase clocks. Digital input signal x(t) is grouped into 2-bit symbols that change every 8 clock cycles as shown below the x-axis. The individual bit rate of x(t) is one bit per 4 clock cycles.

The duration of each phase assignment is a few clock cycles of the modulation carrier, feedback signal θ 0. In this example, a 2-bit mapping assigned 2-bit symbols of x(t) to four possible phase assignments φ 0, φ 1, φ 2, and φ 3. There are 8 clock cycles of the modulation carrier θ 0 for each symbol mapping. Modulated carrier θ R is the phase-modulated output.

When digital input x(n) changes by a large value, such as from 00 to 11, the phase assignment θ R changes over several clock cycles. The bit mapper first changes from 00 to 01, incrementing the counter and causing φ 1 to be selected, then increments to 10, selecting φ 2, before finally incrementing the counter to 11, selecting the final phase φ 3.

Figure 8:
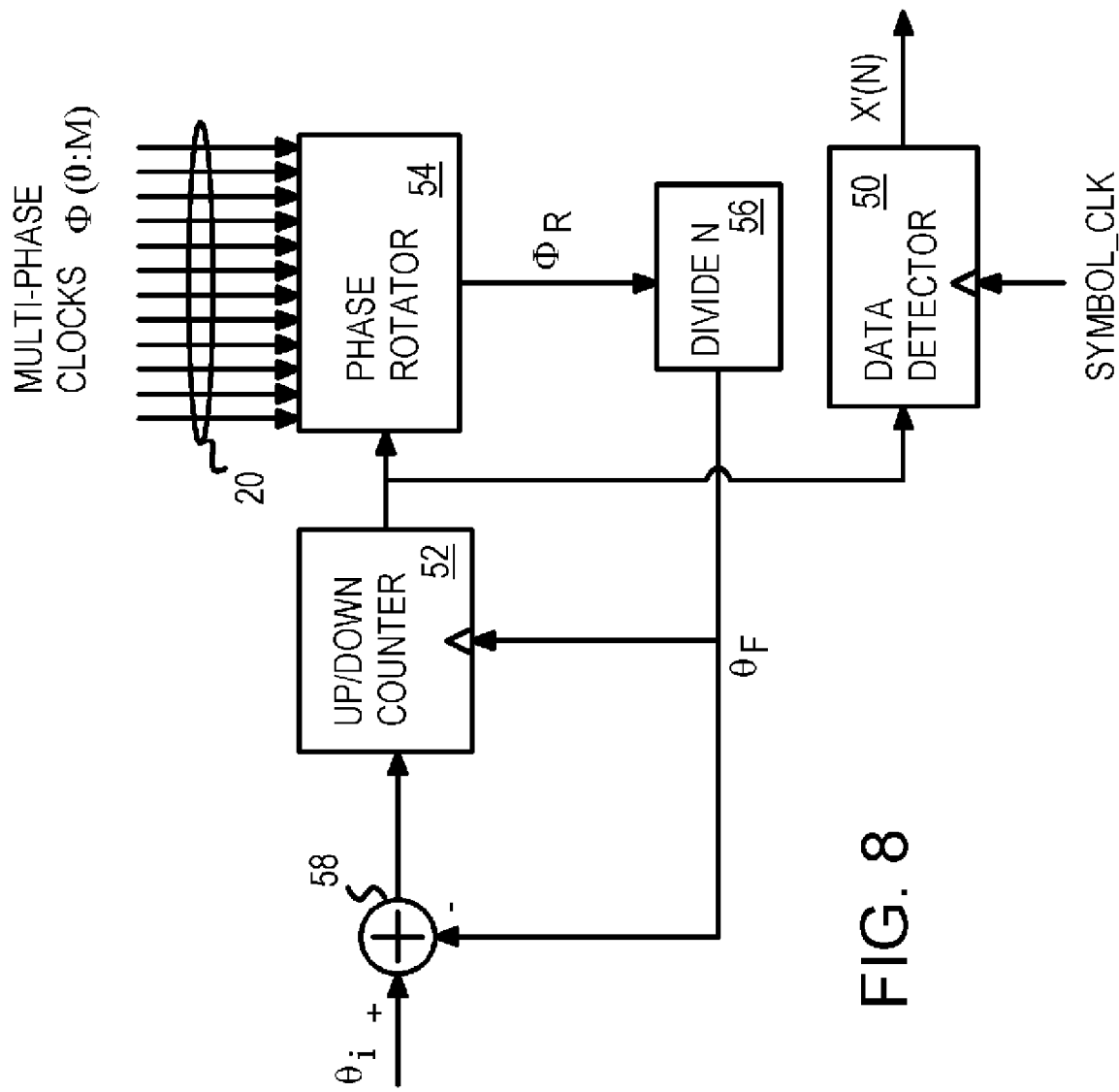
FIG. 8 shows a de-modulator using multi-phase clocks with a digital output.

FIG. 8 shows a de-modulator using multi-phase clocks with a digital output. Phase-modulated signal θ i is received from a communications medium and input to phase comparator 58. Phase comparator 58 compares the phase of the received signal θ i to the phase of the feedback signal θ F. Phase differences increment or decrement up/down counter 52.

The count value from up/down counter 52 is sent to phase rotator 54, causing one of multi-phase clocks 20 to be selected as the rotated clock φ R. The phase selected varies with changes in the count value from up/down counter 52, which changes as a result of phase differences detected by phase comparator 58. The selected clock φ R is divided by divider 56 to generate the feedback signal θ F to phase comparator 58. Up/down counter 52 is clocked by feedback signal θ F.

The count value from up/down counter 52 changes in response to phase changes on the phase-modulated input θ i. Thus the count value in up/down counter 52 represents the phase encodings of the input signal θ i. The count value from up/down counter 52 is applied to data detector 50, which converts the digital count values to digital encodings of digital output signal x'(n).

Digital output signal x'(n) is a reconstruction of digital signal x(n) of FIG. 6, which was the input signal that was transmitted as phase-modulated signal θ R and θ i.

Phase-modulated carrier θ R (FIG. 6) is the transmitted signal while input signal θ i (FIG. 8) is the received signal. Both contain the same phase-encoded information.

Data detector 50 is clocked by a symbol clock. The symbol clock can be derived from θ 0. The symbol clock indicates the symbol boundary of the phase assignments. Data detector 50 de-maps the phase assignments stored in up/down counter 52 to the original binary sequence x(n). Data detector 50 can also provide filtering to the count values from up/down counter 50 to remove any potential transients in the demodulator.

Frequency Offset

The set of multiphase clocks can have the same exact frequency as the one used for the phase-modulated signal if it is available locally. A set of multiphase clocks which has a small frequency offset relative to the phase-modulated signal can also be used in demodulating the signal. If the frequency offset is within 100 parts-per-million (ppm), for instance, one clock cycle could potentially slip after 10,000 clock cycles (or an error of one tenth of a clock cycle after 1,000 clock cycles). The invention can also take advantage of the small frequency offset to demodulate an incoming signal. This can be done by periodically synchronizing the demodulator.

The information to be transmitted can be first divided into smaller frames or packets. Data encoding can be used so that a unique pattern can be defined as a "frame sync pattern". The frame sync pattern, which is used to synchronize the demodulator, marks the beginning of a frame transmission. The frame sync pattern is followed by a data field. The frame then terminates with an "idle pattern". The idle pattern serves as a gap between frame transmissions. A simple 3-bit to 6-bit encoding is shown below:

Encoding Table

| 3-bit Data | 6-bit Encoded Data |
|---|---|
| 000 | 000 000 |
| 001 | 000 001 |
| 010 | 000 010 |
| 011 | 000 011 |
| 100 | 000 100 |
| 101 | 000 101 |
| 110 | 000 110 |
| 111 | 000 111 |

Data encoding can be done by preceding the 3-bit data with 000. The pattern 000 001 010 011 (octal 0123) can be defined as the frame sync pattern since it is a unique pattern. Another unique pattern could be defined as the idle pattern.

The receiver constantly searches for the frame sync pattern (a sequence of 4 consecutive phase assignments: φ 0, φ 1, φ 2, φ 3), which indicates the beginning of a new frame. The receiver then decodes the data field based on the content of the up/down counter that corresponds to the frame sync pattern for each frame reception. Thus, if the frame sync pattern corresponds to octal 1234 of the up/down counter, then the up/down counter values 001, 010, 011, . . . 111, 000 with each preceded by 000 correspond respectively to the originally transmitted binary values of 000, 001, 010, . . . 110, 111.

The frame sync pattern would correspond to different values of the up/down counter over time due to the frequency offset.

The digital nature of this class of digital PLL/demodulator makes it amenable for an all-digital VLSI implementation, alleviating some of the technical difficulties encountered in mixed-signal design applications. The dynamic behavior of this class of digital PLL/demodulator is not only well behaved, but is also inherently stable. The very fine phase resolution that can be provided by the multiphase clocks enables this class of digital PLL/demodulator to operate at high frequency.

ALTERNATE EMBODIMENTS

Several other embodiments are contemplated by the inventor. For example additional components may be added, and inversions or active-low signals may be used. Banks of phase rotators may be used. A nested counter and nested phase rotators may be used to select the multi-phase clock in a multi-level scheme. Various filtering can be added, such as to smooth the loop responses. Rather than use the first multi-phase clock ϕ 0 for feedback, other multi-phase clocks could be selected as the fixed clock. The feedback and output dividers could use different divisors N, P rather than the same divisor. The multi-phase clocks could be a subset of the possible phases, such as by skipping every other phase, or only using one-quarter of the possible phases.

Voltage limiter 26 can be combined with comparator 28 in some implementations. The voltage limiter can be voltage comparator. A voltage summing or difference circuit could also be used. The integrator could also be a capacitor with a current source. Other implementations are possible.

Converter 40 of FIG. 5 can be a conventional digital-to-analog converter (DAC) using a variety of implementations, such as a table converter, current-summing, or other converters. The bit mapper of FIG. 6 can use different numbers of bits per symbol, such as four or eight bits per symbol, when more phases of multi-phase clocks are used for encoding. The up/down counter could have separate increment and decrement signals, or a combined increment/decrement signal, or multi-bit encoded inputs that function as the increment and decrement signal or signals.

The fixed-phase clock ϕ 0 could be one of the multi-phase clocks or it could be another clock with a same frequency as the multi-phase clocks, or could have a frequency already divided down from the frequency of the multi-phase clocks.

The phase rotator can be implemented using transmission gates, multiplexers, or other selection logic. Since the up/down counter is incremented and decremented by one, and does not jump by values greater than one per clock cycle during normal operation, the phase selected by the phase rotator only changes by one phase offset per clock cycle. Large phase shifts can take place over several clock cycles. Other encodings may be used, such a Manchester-type encodings.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electric signals, but may be converted to optical signals such as can be carried over a fiber optic line as the communications medium, or converted to radio waves or other radiation for transmission over an "airwave" medium.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A modulator comprising:
    a plurality of multi-phase clocks, each clock of multi-phase clocks having a same frequency but being offset in phase from other clocks in the plurality of multi-phase clocks;
    a phase rotator, coupled to the plurality of multi-phase clocks, for selecting a selected clock from the plurality of multi-phase clocks in response to a count value;
    an up/down counter, responsive to an increment signal, for increasing or decreasing the count value to the phase rotator;
    an output divider, receiving the selected clock from the phase rotator, for generating a phase-modulated output signal that is phase-modulated in response to changes in the count value from the up/down counter;
    a feedback divider, receiving a fixed-phase clock having the same frequency as the plurality of multi-phase clocks, for generating a feedback clock;
    wherein the up/down counter receives the feedback clock, the up/down counter changing the count value synchronously to the feedback clock;
    wherein the fixed-phase clock is one of the plurality of multi-phase clocks permanently selected by the phase rotator for output to the feedback divider; and
    a clocked front-end, receiving the feedback clock and an input signal, for generating the increment signal in response to changes of the input signal, wherein the feedback clock synchronizes the clocked front-end,
    whereby changes to the input signal cause the phase rotator to select different phase clocks from the plurality of multi-phase clocks to adjust phase of the phase-modulated output signal.

2. The modulator of claim 1 wherein the input signal is a digital signal that varies with time, wherein the clocked front-end further comprises:
    a bit mapper that receives the digital signal and activates the increment signal to the up/down counter in response to changes in the digital signal;

wherein the bit mapper is clocked by the feedback clock and activates the increment signal synchronously to the feedback clock, whereby the digital signal is converted to the phase-modulated output signal by incrementing the up/down counter.

3. The modulator of claim 2 wherein the bit mapper encodes a plurality of bits of the digital signal as a multi-bit symbol, whereby groups of bits are encoded together to produce phase modulations.

4. The modulator of claim 3 wherein the bit mapper activates the increment signal for several cycles of the feedback clock for large changes to the multi-bit symbol, but activates the increment signal for one cycle of the feedback clock for small changes to the multi-bit symbol, whereby large phase changes are spread over multiple cycles of the feedback clock.

5. The modulator of claim 1 wherein the up/down counter is a modulo counter that loops back to zero when incremented from a highest count value.

6. The modulator of claim 1 wherein the output divider divides by a factor of M, wherein M is a whole number;

wherein the feedback divider divides by a factor of N, wherein N is a whole number;

wherein M and N are a same whole number or are different whole numbers.

7. A modulator comprising:

a plurality of multi-phase clocks, each clock of multi-phase clocks having a same frequency but being offset in phase from other clocks in the plurality of multi-phase clocks;

a phase rotator, coupled to the plurality of multi-phase clocks, for selecting a selected clock from the plurality of multi-phase clocks in response to a count value;

an up/down counter, responsive to an increment signal, for increasing or decreasing the count value to the phase rotator;

an output divider, receiving the selected clock from the phase rotator, for generating a phase-modulated output signal that is phase-modulated in response to changes in the count value from the up/down counter;

a feedback divider, receiving a fixed-phase clock having the same frequency as the plurality of multi-phase clocks, for generating a feedback clock; and a clocked front-end, receiving the feedback clock and an input signal, for generating the increment signal in response to changes of the input signal, wherein the feedback clock synchronizes the clocked front-end;

wherein the up/down counter receives the feedback clock, the up/down counter changing the count value synchronously to the feedback clock;

wherein the input signal is an analog voltage that varies with time, wherein the clocked front-end further comprises:

a latch that receives the increment signal to the up/down counter and is clocked by the feedback clock and produces a latched increment signal;

an integrator, coupled to the latch, for accumulating the latched increment signal to generate an analog-input estimate;

a comparator, receiving the input signal and the analog-input estimate, for comparing the analog voltage to the analog-input estimate;

a limiter, coupled to the comparator, for generating the increment signal to the up/down counter by converting voltage differences detected by the comparator to a digital signal that indicates when to increment the up/down counter, whereby changes to the input signal cause the phase rotator to select different phase clocks from the plurality of multi-phase clocks to adjust phase of the phase-modulated output signal and whereby the analog voltage of the input signal is converted to a digital increment signal to the up/down counter to convert the analog voltage to the phase-modulated output signal.

8. The modulator of claim 7 wherein the comparator and the limiter output a digital one to increment the up/down counter for positive voltage differences but output a digital zero to decrement the up/down counter for negative voltage differences.

9. A phase modulator selecting multi-phase clocks comprising:

multi-phase clock generator means, receiving a reference clock, for generating a plurality of multi-phase clocks having a phase-clock frequency but different phases;

input sampling means, receiving an input signal for encoding as a phase-encoded signal, for generating a counter-control signal synchronized to a feedback clock;

counter means, responsive to the counter-control signal, for incrementing and decrementing a count value;

phase select means, responsive to the count value from the counter means, for selecting as a rotated clock one of the plurality of multi-phase clocks in response to the count value;

output divider means, receiving the rotated clock from the phase select means, for generating the phase-encoded signal as an output;

feedback divider means, receiving a fixed-phase clock having the phase-clock frequency and a phase that does not vary with the count value, for generating the feedback clock;

wherein the counter-control signal includes increment and decrement signaling means for commanding the counter means to increment and decrement the count value;

wherein the plurality of multi-phase clocks comprises at least 8 multi-phase clocks having 8 different phases;

wherein the input sampling means comprises a bit-map means for convening multi-bit sequences of digital bits on the input signal to the counter-control signal, or wherein the input sampling means comprises an analog front end that comprises:

voltage compare means, receiving the input signal as an analog voltage, for comparing an accumulated feedback voltage to the input signal to generate the counter-control signal;

latch means, clocked by the feedback clock, for sampling the counter-control signal to generate a sampled signal; and accumulate means, receiving the sampled signal, for generating the accumulated feedback voltage by accumulating the sampled signal over several cycles of the feedback clock, whereby the input signal is sampled to increment and decrement the counter means and select a phase from the plurality of multi-phase clocks to generate the phase-encoded signal from the input signal.

* * * * *